United States Patent [19]
Lee

[11] Patent Number: 5,604,366
[45] Date of Patent: *Feb. 18, 1997

[54] FLOATING GATE MEMORY DEVICE HAVING DISCONTINUOUS GATE OXIDE THICKNESS OVER THE CHANNEL REGION

[75] Inventor: Roger R. Lee, Boise, Id.

[73] Assignee: Micron Technology, Inc., Boise, Id.

[ * ] Notice: The term of this patent shall not extend beyond the expiration date of Pat. No. 5,444,279.

[21] Appl. No.: 409,371

[22] Filed: Mar. 22, 1995

Related U.S. Application Data

[63] Continuation of Ser. No. 243,442, May 16, 1994, Pat. No. 5,444,279, which is a continuation of Ser. No. 104,753, Aug. 11, 1993, abandoned.

[51] Int. Cl.$^6$ .................................. H01L 29/788
[52] U.S. Cl. ................ 257/316; 257/325; 257/335; 257/401; 257/406
[58] Field of Search .................... 257/316, 324, 257/325, 326, 335, 389, 401, 404, 406, 411

[56] References Cited

U.S. PATENT DOCUMENTS

| | | | |
|---|---|---|---|
| 4,794,433 | 12/1988 | Kamiya et al. | 257/321 |
| 5,051,794 | 9/1991 | Mori | 257/316 |
| 5,422,505 | 6/1995 | Shirai | 257/401 |

FOREIGN PATENT DOCUMENTS

| | | | |
|---|---|---|---|
| 0446893 | 9/1991 | European Pat. Off. | 257/315 |
| 0332063 | 2/1991 | Japan | 257/355 |

*Primary Examiner*—Mark V. Prenty
*Attorney, Agent, or Firm*—Kevin D. Martin

[57] ABSTRACT

A method and structure for a programmable read-only memory comprises a thin gate oxide over a source region and a thick gate oxide over the drain region. A semiconductor substrate is lightly doped and has regions of thin sacrificial oxide overlying what will become the transistor channel, source, and drain, and thick field oxide. The region that will become the transistor source is protected with photoresist, and the drain region and a portion of the channel is doped, for example, with boron. The resist and sacrificial oxide is stripped, and gate oxide is formed from the exposed silicon substrate. The more heavily doped drain and channel regions oxidize at a faster rate than the lightly doped source region, and thus the gate oxide formed is thicker. Floating and control gates are formed over the channel region, covering both the thicker and thinner gate oxide. The cell resulting from the process has increased coupling coefficient, easier programmability, and better storage of the charge on the floating gate than a conventional cell.

17 Claims, 3 Drawing Sheets

FLOATING GATE MEMORY DEVICE HAVING DISCONTINUOUS GATE OXIDE THICKNESS OVER THE CHANNEL REGION

This is a continuation of application Ser. No. 08/243,442, filed 05/16/94, now U.S. Pat. No. 5,444,279 issued 08/22/95, which is a continuation of application Ser. No. 08/104,753, filed 08/11/93, now abandoned.

FIELD OF THE INVENTION

The invention relates to the field of semiconductor manufacture, and more specifically to the manufacture of nonvolatile memories.

BACKGROUND OF THE INVENTION

Erasable Programmable Read-only Memories (EPROMs), Electrically Erasable Programmable Read-only Memories (E$^2$PROMs), and Flash E$^2$PROMs (hereafter collectively, PROMs or nonvolatile memory devices) have several structures which allow them to hold a charge without refresh for extended periods of time. FIG. 1 shows a top view of a PROM array, FIG. 2 shows a cross section along "AA" of FIG. 1, and FIG. 3 shows a cross section along "BB" of FIG. 1. The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the "control gate" 14 or P2. P1 10 and P2 14 function as two plates of a capacitor. Below the P1 layer are two N+ junctions, one which functions as the transistor source 16 and the other as the drain 18, which are doped into a P-type substrate 20. The portion of the substrate 20 between the source 16 and the drain 18 is the channel 22. The cell functions as an enhancement-type N-channel metal oxide semiconductor field effect transistor (MOSFET) with two gates of poly.

There are structures that make up a PROM array which are common to several transistors in the array. FIG. 1 shows the transistor sources 16, drains 18, digit lines 24, floating gates 10, and control or "word" lines 26 which form control gates 14 as they pass over the floating gates 10. Also shown as a dotted line is the "active area" 28 interspersed with areas of field oxide 30. A single word line 26 is common to all transistors in a single column functions as a control gate 14 for all transistors in the column. When the word line is selected it activates all transistors in the column. The source regions 16, which run parallel with the control lines 26, are common to all transistors in two adjacent columns. Individual transistor drains 18 are common to two transistors in adjacent columns. The digit (or bit) lines 24 are common with the drains 18 of all transistors in a single row.

The potential which must be applied on the control gate to turn on the transistor is much higher in a device storing a charge than in a device which does not have a potential stored on P1. To read the content of the floating gate, a potential somewhere between the low and high potential values (i.e. the threshold voltage $V_t$) is applied to the control gate. If a cell is set to a zero, arbitrarily defined by storing −3 V on the floating gate 10, and 5 V is applied to the control gate, the net difference in potential which effects the transistor channel is not great enough to allow the electrons to pass from the source to the drain. Assuming a 0.7 coupling coefficient (described below) the effect on the transistor is defined as −3.0 V+(5 V×0.7)=0.5 V. If $V_t$ is 1.0 V, the transistor will not trip. If a cell is set to a one, arbitrarily defined by storing 0 V on the floating gate 10, the 5 V difference between the control gate and the source will affect the channel greatly enough to allow electrons to pass between the source and drain. Assuming the same 0.7 coupling coefficient, the effect on the transistor is defined as 0 V+(5 V×0.7)=3.5 V. After the control gate 26 is activated, each cell along that control gate 26 outputs the cell information on their respective digit lines 24, either an OFF if the floating gate is storing a −3.0 V or an ON if the cell is storing 0.0 V. The information on the digit line 24 which corresponds to the cell to be read is obtained with a sense amplifier (not shown), with one sense amp for each digit line.

In a conventional Flash E$^2$PROM cell, the floating gate and the control gate are both manufactured from N-type poly. The floating gate and control gate are both highly doped with N+ material. The substrate is P-type conductivity with N+ junctions which form the source and drain regions. To manufacture N-type poly, a poly structure is doped with atoms having more than four valence electrons (group V or higher), such as arsenic or phosphorus, which introduces negatively charged majority carriers into the silicon and makes the semiconductive material much more conductive than nondoped poly due to electron conduction.

There are many ways to program a PROM. In one technique, a potential such as 12 V, for example, is applied on the control gate. Simultaneously, a voltage pulse, for example 8 V, is applied between source and drain. The large positive potential on the control gate establishes an electric field in the insulating oxide. This electric field attracts the electrons generated from the so-called "avalanche breakdown" or "hot electrons" of the transistor due to the high drain and control gate potentials, and accelerates them toward the floating gate, which they enter through the oxide dielectric. In this way the floating gate is charged, and the charge that accumulates on it becomes trapped.

The amount of electron flow is determined partly by the thickness of the gate oxide. If the gate oxide is very thin, the electron flow can be relatively large. In this case, a lower voltage can be applied on the drain and control gate. If the oxide is thicker, the electron flow is small and a large potential must be applied to the drain and control gate to influence the electrons to pass through the gate oxide to the floating gate.

Another programming method is by Fowler-Nordheim tunneling. By applying a high potential on the word line and grounding the source and/or the drain, electrons will tunnel through the thin gate oxide to the floating gate. Fowler-Nordheim tunneling is critically determined by the potential between the control gate and the source and/or drain (and therefore the electric field) and the thickness of the gate oxide.

To return the floating gate from a charged state to a state with no charge (erase), the electrons are caused to return to the substrate. In an EPROM, this is accomplished with ultraviolet light which excites the electrons past a certain energy state, thereby allowing them to pass through the oxide and return to the substrate. In an E$^2$PROM, this excitation is accomplished with an electrical field.

The floating gate of an E$^2$PROM forms a capacitor with the control gate, as described above, and also with the source, the drain, and the channel. This arrangement is described in FIG. 4. The coupling capacitances associated with P1 are described by the coupling coefficient, which is depicted by the equation (referring to FIG. 4):

$$CC = \frac{C1}{(C1 + C2 + C3 + C4)}$$

where CC is the coupling coefficient, C1 represents the coupling between P1 and P2, C2 represents the coupling between P1 and the source, C3 represents the coupling between P1 and the drain, and C4 represents the coupling between P1 and the channel. As can be determined from the equation, the coupling coefficient can never reach the ideal state (1.00) since the capacitance between the floating gate and the control gate is always divided by itself plus some additional capacitance. Still, the goal of designers is to bring the coupling coefficient as close to unity as possible.

The coupling between the floating gate and the channel (C4 in the equation above) is partially determined by the thickness of the gate oxide under the floating gate. Thinning the oxide has various advantageous and detrimental effects on the functionality of the cell. With a relatively thin gate oxide, which can range from about 100 Å to about 150 Å with current technology, the cell requires less voltage to program. The thinner gate oxide allows an easier passage of the electrons from the source (or drain) region to the floating gate, thereby requiring less voltage to program the array. In addition to requiring less power, the programming of one cell does not as greatly affect an adjacent cell (less disturbance), and the data is more reliably written into the cell with the thinner gate oxide. Thinning the gate oxide, however, increases the capacitance between the floating gate and the substrate as the two "plates" of the capacitor are closer together. As seen in the equation above, this decreases the coupling coefficient. A thin gate oxide, while an aid in programming, adversely affects the storage of the charge on the floating gate for the same reason, that electrons can more easily pass through the gate oxide, and can therefore discharge from the floating gate to the substrate.

Conversely, a cell with a thicker gate oxide, for instance from about 150 Å to about 250 Å, has a larger distance between the two plates of the capacitor (the floating gate and the transistor channel region) and a coupling coefficient which is not adversely affected by C4. This cell has a thicker tunneling dielectric, and therefore an excellent storage of the charge on the floating gate as the charge does not easily leak from the floating gate to the substrate through the thick gate oxide. However, it is difficult to program this cell, and programming requires a higher potential. This increases power consumption and the programming of one cell can adversely affect an adjacent cell.

Attempts have been made to create a cell with a large percentage of thick gate oxide under the floating gate for good storage of the charge, and an area under the floating gate having thin gate oxide to allow for low voltage programming. While a cell with these specifications functions effectively, attaining this structure reliably has proven to be difficult, especially with high density devices. A more easily manufacturable PROM cell having the advantages of both thick and thin gate oxide would be a desirable structure.

SUMMARY OF THE INVENTION

An embodiment of the inventive method comprises regions of field oxide and sacrificial oxide over a lightly doped semiconductor Substrate. A patterned layer of photoresist is formed over a portion of the sacrificial oxide, while a second portion of the sacrificial oxide is left exposed. The wafer surface is doped, and the lightly doped semiconductor substrate is further doped through the exposed sacrificial oxide. This forms a relatively heavier doped area in the semiconductor substrate, while the substrate remains lightly doped under the resist layer. This implant can be performed at the same time as the channel stop implant.

Next, the photoresist is removed as is the sacrificial oxide layer. This exposes the semiconductor substrate. The lightly doped substrate and the more heavily doped substrate are oxidized. The more heavily doped regions of the substrate oxidize at a faster rate, and thus result in a thicker gate oxide in those regions. The lightly doped substrate oxidizes at a slower rate than the more heavily doped substrate, and the oxidized regions resulting therefrom are therefore thinner.

Finally, floating and control gates are formed over the thick and thin gate oxide. The portions of the floating and control gates that overlie the thick gate oxide are further away from the substrate than the portions of the floating and control gates that overlie the thin gate oxide.

Other advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 5:
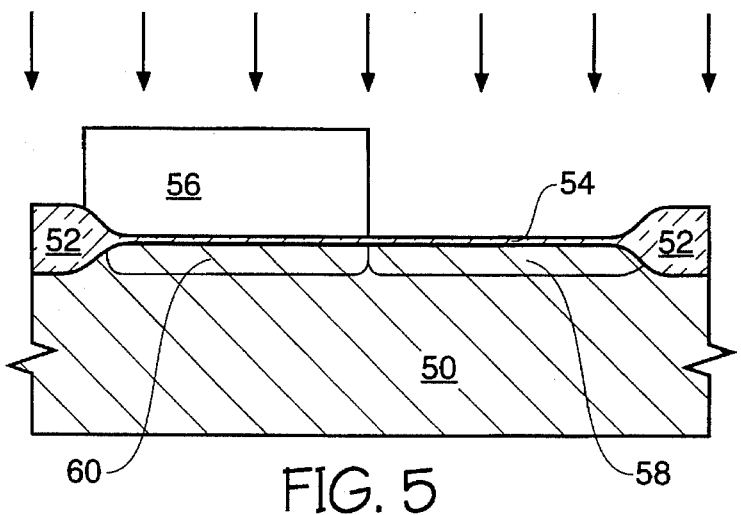
FIG. 5 is a cross section showing a first step of one embodiment of the invention showing the doping of the underlying substrate.

In accordance with one embodiment of the invention as shown in FIG. 5, a lightly doped semiconductor substrate 50 is formed having layers of field oxide 52 and sacrificial oxide 54. The semiconductor substrate 50 is doped with boron or other p-type dopant in the active area to an impurity concentration of about 1E16 ions/cm$^3$ to about 5E17 ions/cm$^3$ during the course of wafer fabrication before FIG. 5. The field oxide 52 generally has a thickness of between about 3000 Å and about 6000 Å, and the sacrificial oxide 54 has a thickness of between about 150 Å and about 500 Å, although other thicknesses would function sufficiently.

Next, a mask 56, for example of photoresist, is formed over what will eventually function as the transistor source region and a portion of what will be the channel region. What will form the transistor drain region is left exposed as shown in FIG. 5. FIG. 5 shows about 50% of the channel region covered by the resist but other percentages would also be possible and sufficient to alter the electrical characteristics of the transistor. For example, from about 10% to 90% of the channel region could be covered with thick oxide to provide a cell having altered electrical characteristics and the advantages of the increased gate oxide thickness.

During the formation of a conventional structure, a field implant mask is formed over the entire active area, and the substrate is implanted through the field oxide. This mask could be shortened somewhat to leave the transistor drain region and a portion of the channel region exposed, and therefore no additional mask steps would be required for the inventive cell structure.

Figure 6:
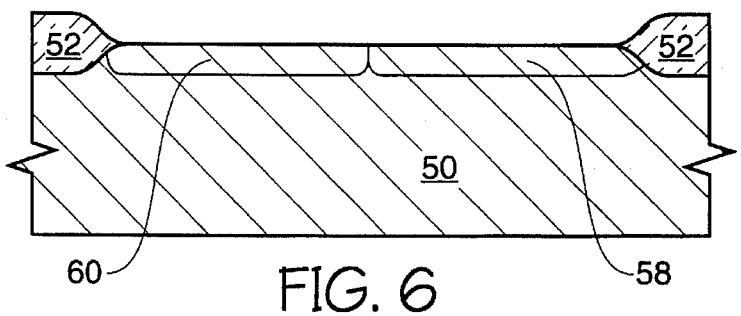
FIG. 6 is a cross section showing an intermediate step of one embodiment of the invention.

In any case, the wafer surface is doped, for example with boron, as shown in FIG. 5. The exposed channel and drain regions 58 are thereby more heavily doped with boron than is the covered source and channel regions 60. For example, the exposed active area 60 is doped with boron to an impurity concentration of about 1E18 ions/cm$^3$, while the covered source and channel regions 60 were originally doped to a concentration of between about 1E16 and about 5E17 ions/cm$^3$. After further doping the exposed regions of the active area 58 the mask 56 and sacrificial oxide 54 are removed to result in the structure of FIG. 6.

Figure 7:
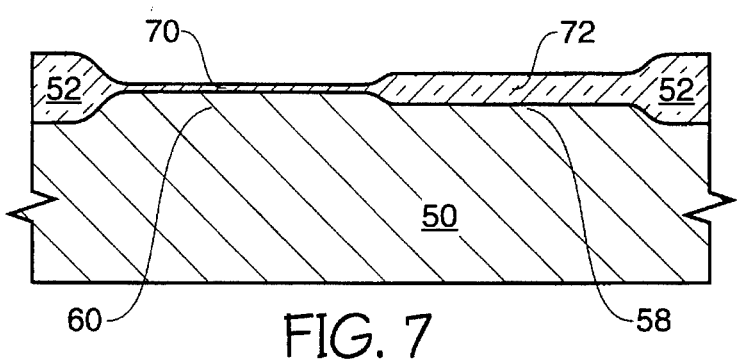
FIG. 7 shows the FIG. 6 structure after the formation of the gate oxide.
Figure 8:
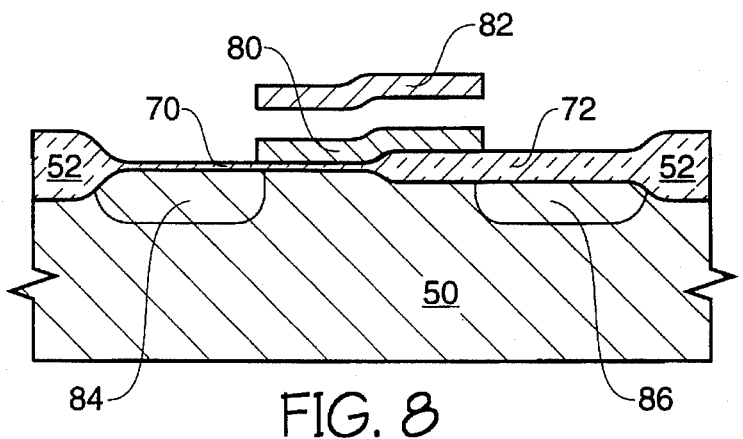
FIG. 8 shows the FIG. 7 structure after the formation of the floating and control gates.

The exposed semiconductor substrate is oxidized by any means known in the art, for example thermal oxidation, to form gate oxide 70, 72 as shown in FIG. 7. The more heavily doped channel and drain regions 58 form a thicker gate oxide 72 than do the more lightly doped channel and source regions 60, as the more heavily doped regions 58 oxidize at a faster rate. For example, the gate oxide 70 over the more lightly doped channel and source regions 60 can be between about 100 Å and about 120 Å, and the thicker oxide 72 over the more heavily doped channel and drain regions 58 can have a thickness of between about 200 Å and about 350 Å, although other thicknesses would function sufficiently. After the formation of the gate oxide 70, 72, floating 80 and control gates 82 are formed as shown in FIG. 8. Another implant may be necessary to form the source 84 and drain 86 of the transistor, for example with arsenic to form N+ areas, as can be determined by an artisan of skill in the art.

Figure 1:
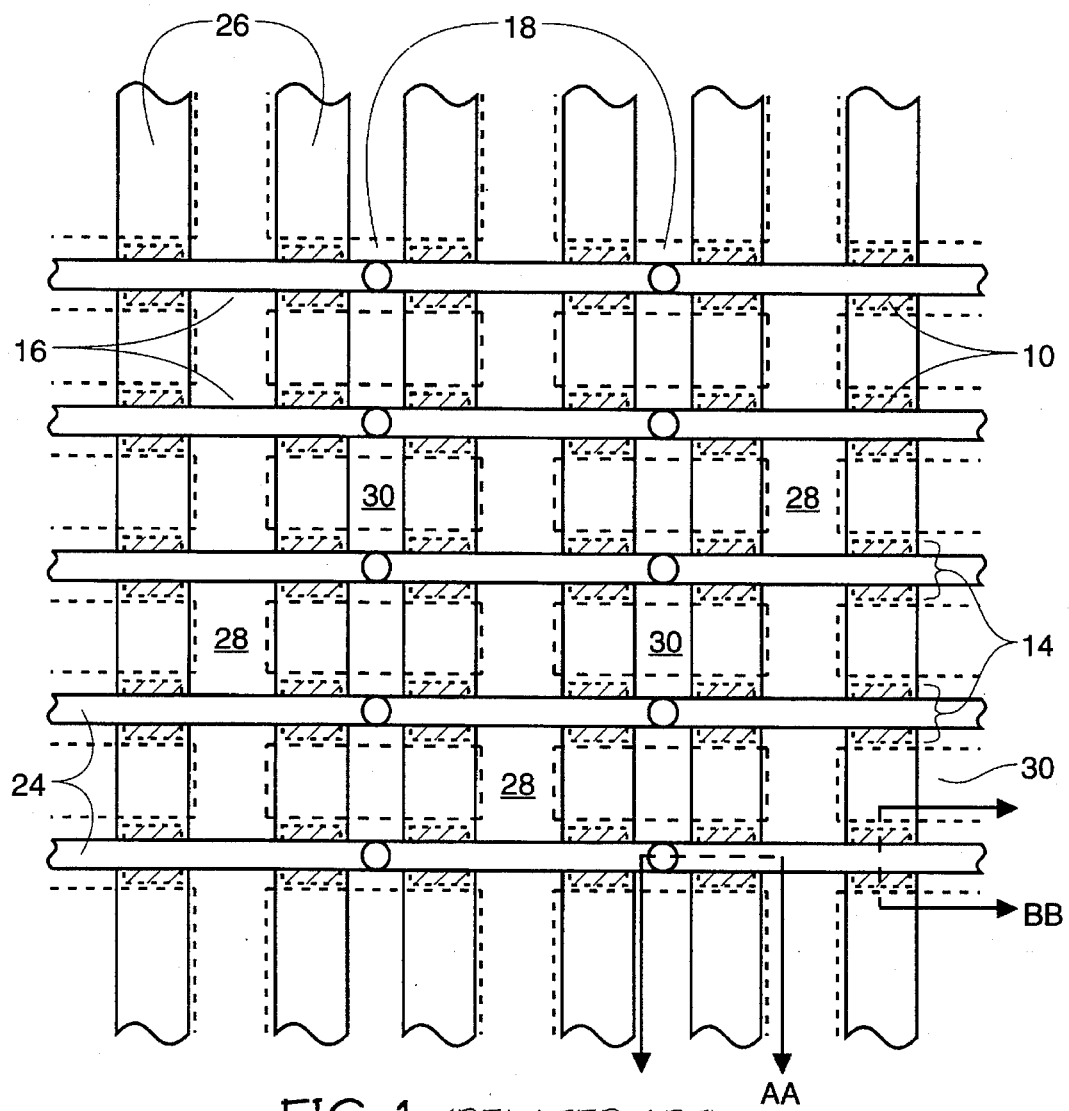
FIG. 1 is a top view of a PROM array
Figure 2:
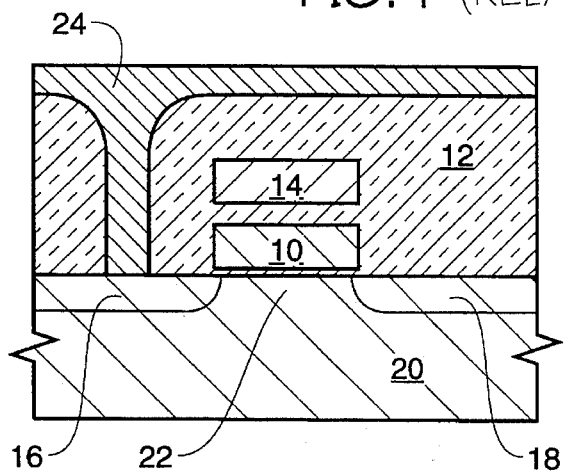
FIG. 2 is a cross section of the FIG. 1 PROM array along "AA"
Figure 3:
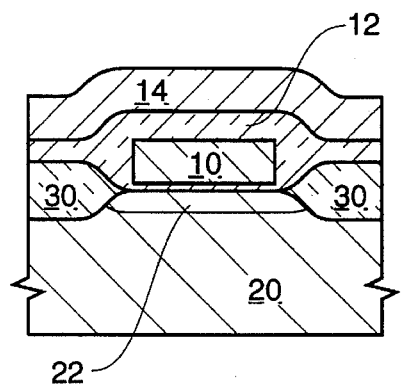
FIG. 3 is a cross section of the FIG. 1 PROM array along "BB"

It can be seen in the FIG. 8 cross-section perpendicular with the control line (26 in FIG. 1) across the field oxide 52, the channel, and the source 84 and drain 86 regions that the control gate 82 and the floating gate 80 overlie the thick 72 and thin 70 gate oxide.

Figure 4:
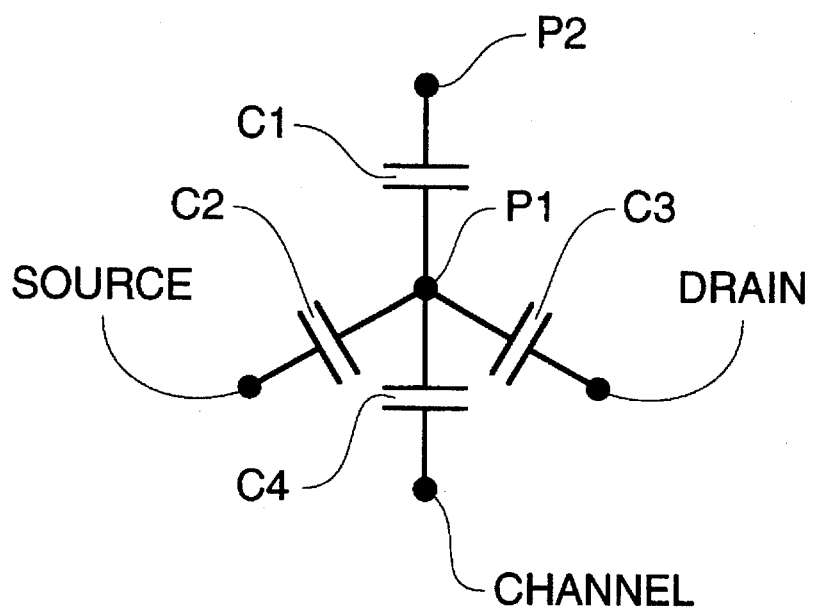
FIG. 4 shows the capacitances associated with the cell structures of a PROM.

The portion of the floating 80 and control 82 gates which overlie the thin gate oxide 70 are closer to the silicon substrate 50 than the portions which overlie the thick gate oxide 72. This results in a decreased coupling between the floating gate P1 and the transistor channel and drain (referring to FIG. 4). Therefore, in the equation $$CC = \frac{C1}{(C1 + C2 + C3 + C4)}$$

the terms C3 and C4 as described in the background section decrease, and the overall coupling coefficient "CC" increases nearer to the ideal value of "1". In addition, the drain region has an increased number of "hot electrons" due to the higher boron concentration, and therefore the PROM is easier to program. Finally, the thicker gate oxide over the channel and drain regions provides better insulation for the floating gate and reduces the number of electrons which will bleed off the floating gate through the gate oxide to the substrate. This increases the amount of time the floating gate can store a charge and improves reliability of the PROM.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A memory device comprising:
   a) first and second dielectric regions formed over a channel region, said first dielectric region having a thickness of from about 100 Å to about 120 Å and said second dielectric region having a thickness of from about 200 Å to about 350 Å;
   b) a transistor gate formed over said first and second dielectric regions,
   wherein in a cross-section perpendicular with a control line which comprises said gate, said gate overlies said first and second dielectric regions;
   a first channel region having a first impurity concentration under said first dielectric region and a second channel region having a second impurity concentration under said second dielectric region, said first impurity concentration being less than said second impurity concentration.

2. The memory cell of claim 1 wherein said first impurity concentration is in the range from about 1E16 ions/cm$^3$ to about 5E17 ions/cm$^3$ and said second impurity concentration is about 1E18 ions/cm$^3$.

3. The memory cell of claim 1 wherein said second dielectric region covers at least 10% of said channel.

4. The memory cell of claim 1 wherein said second dielectric region covers about 50% of said channel.

5. The memory cell of claim 1 wherein said second dielectric region covers less than about 90% of said channel.

6. A programmable memory device comprising:
   a) first and second dielectric regions formed over a channel region, said first dielectric region being thinner than said second dielectric region wherein a first impurity concentration of said channel under said first dielectric region is in the range from about 1E16 ions/cm$^3$ to about 5E17 ions/cm$^3$ and a second impurity concentration of said channel under said second dielectric region is about 1E18 ions/cm$^3$;
   b) a floating gate formed over said first and second dielectric regions;
   c) a control gate formed over said floating gate,
   wherein in a cross-section perpendicular with a control line which comprises said control gate, said control gate overlies said first and second dielectric regions.

7. The memory device of claim 6 wherein said first dielectric region has a thickness of from about 100 Å to about 120 Å and said second dielectric region has a thickness of from about 200 Å to about 350 Å.

8. The memory cell of claim 6 wherein said second dielectric region covers at least 10% of said channel.

9. The memory cell of claim 6 wherein said second dielectric region covers about 50% of said channel.

10. The memory cell of claim 6 wherein said second dielectric region covers less than about 90% of said channel.

11. A programmable memory device comprising:
   a) first and second channel regions, said first channel region having an impurity concentration which is less than an impurity concentration of said second channel region;

b) first and second gate oxide regions formed over said first and second channel regions respectively, said first gate oxide region being thinner than said second gate oxide region and said second gate oxide region covering about 50% of said channel;

c) a floating gate formed over said first and second gate oxide regions;

d) a control gate formed over said floating gate, wherein in a cross-section perpendicular with a control line which comprises said control gate, said control gate overlies said first and second gate oxide regions.

12. The memory device of claim 11 wherein said first gate oxide region has a thickness of from about 100 Å to about 120 Å and said second gate oxide region has a thickness of from about 200 Å to about 350 Å.

13. The memory cell of claim 11 wherein said first impurity concentration is in the range from about 1E16 ions/cm$^3$ to about 5E17 ions/cm$^3$, and said second impurity concentration is about 1E18 ions/cm$^3$.

14. The memory cell of claim 11 wherein said second gate oxide region covers at least 10% of said channel.

15. The memory cell of claim 11 wherein said second gate oxide region covers less than about 90% of said channel.

16. A memory device comprising:

a) first and second channel regions, said first channel region having an impurity concentration in the range from about 1E16 ions/cm$^3$ to about 5E17 ions/cm$^3$ and said second channel region having an impurity concentration of about 1E18 ions/cm$^3$;

b) first and second dielectric regions formed over said first and second channel regions respectively, said first dielectric region being thinner than said second dielectric region;

c) a transistor gate foraged over said first and second dielectric regions, wherein in a cross-section perpendicular with a control line which comprises said gate, said gate overlies said first and second dielectric regions.

17. The memory cell of claim 16 wherein said first and second channel regions form a transistor channel, and said second dielectric region covers about 50% of said channel.

* * * * *

UNITED STATES PATENT AND TRADEMARK OFFICE
CERTIFICATE OF CORRECTION

PATENT NO.   : 5,604,366
DATED        : February 18, 1997
INVENTOR(S)  : Lee

It is certified that error appears in the above-indentified patent and that said Letters Patent is hereby corrected as shown below:

Column 1, line 46, after "column" please insert -- and --.

Column 3, line 63, please replace "Substrate" with -- substrate --.

Column 4, line 27, after "array" please insert -- ; -- (a semicolon).

Column 5, lines 26 through 47 should be a single paragraph.

Column 6, line 31, after "ions/cm3" please insert -- , -- (a comma).

Column 8, line 14, please replace "foraged" with -- formed --.

Signed and Sealed this

Thirteenth Day of May, 1997

*Attest:*

BRUCE LEHMAN

*Attesting Officer*   Commissioner of Patents and Trademarks